United States Patent [19]

Matsui et al.

[11] Patent Number: 4,742,526

[45] Date of Patent: May 3, 1988

[54] SEMICONDUCTOR LASER ARRAY DEVICE

[75] Inventors: Sadayoshi Matsui; Mototaka Taneya; Mitsuhiro Matsumoto, all of Tenri, Japan

[73] Assignee: Sharp Kabushiki Kaisha, Osaka, Japan

[21] Appl. No.: 816,311

[22] Filed: Jan. 6, 1986

[30] Foreign Application Priority Data

Jan. 12, 1985 [JP] Japan .................................. 60-3780
Jan. 16, 1985 [JP] Japan .................................. 60-6149

[51] Int. Cl.$^4$ .......................... H01S 3/19; H01S 3/13; H01S 3/082
[52] U.S. Cl. ........................................ 372/44; 372/29; 372/48; 372/50; 372/97; 372/45
[58] Field of Search ................. 372/44, 48, 50, 45, 372/97, 29

[56] References Cited

U.S. PATENT DOCUMENTS 4,047,124 9/1977 Comerford et al. .................. 372/50
4,255,717 3/1981 Scifres et al. ......................... 372/50
4,318,058 3/1982 Mito et al. ........................... 372/50

FOREIGN PATENT DOCUMENTS 0010949 6/1983 European Pat. Off. .
0083980 7/1983 European Pat. Off. .
2163001 2/1986 United Kingdom .
2166903 5/1986 United Kingdom .

Primary Examiner—Eugene R. LaRoche
Assistant Examiner—Michael B. Shingleton
Attorney, Agent, or Firm—Birch, Stewart, Kolasch & Birch

[57] ABSTRACT

A semiconductor laser array device comprising an optical waveguide which is in a single mode or a multiple mode in the center portion thereof and is in a branching mode at each of both end portions thereof to form a plurality of branching waveguides which are positioned symmetrically with respect to the waveguiding direction of the laser beams and which are parallel to each other near the facets, thereby oscillating laser beams with a 0°-phase shift therebetween.

3 Claims, 4 Drawing Sheets

SEMICONDUCTOR LASER ARRAY DEVICE

BACKGROUND OF THE INVENTION

1. Field of the Invention:

This invention relates to a semiconductor laser array device which oscillates high output power laser lights with a 0°-phase shift therebetween.

2. Description of the Prior Art:

Semiconductor laser devices having a single lasing filament structure can only produce 50–80 mW lights at best. In order to produce high output power, semiconductor laser devices, in which a plurality of lasing filaments are disposed in a parallel manner on the same substrate to achieve an optical phase coupling between the adjacent lasing filaments, have been studied.

In the case where a plurality of index-guided semiconductor laser devices are disposed in a parallel manner with an optical phase coupling between the adjacent lasing filaments and the individual laser devices have the same gain, they tend to oscillate laser lights with a 180°-phase shift therebetween rather than with a 0°-phase shift therebetween. This is because, in the 180°-phase shift mode, the electric field in the center area between the adjacent lasing filaments is zero while the electric field in the center area of each of the lasing filaments exhibits the maximum value, so that the electric field distribution is in accord with the gain distribution in the 180°-phase shift mode rather than in the 0°-phase shift mode, resulting in high oscillation gain.

The far-field pattern of laser lights with a 0°-phase shift therebetween exhibits a single peak so that the laser lights can be concentrated into a spot by means of optical lenses, whereas the far-field pattern of laser lights with a 180°-phase shift therebetween exhibits dual peaks so that the laser lights cannot be concentrated into a spot by any optical lens. These semiconductor laser array devices producing laser lights which cannot be concentrated into a spot are inconvenient in an optical coupling with other optical systems, and cannot be used as light sources for optical communication. Thus, creation of a semiconductor laser array device oscillating laser lights with a 0°-phase shift therebetween (i.e., attaining higher oscillation gain in the 0°-phase shift mode than in the 180°-phase shift mode), which can thereby be utilized as a light source for optical communication, is required.

SUMMARY OF THE INVENTION

The semiconductor laser array device of this invention which overcomes the above-discussed and numerous other disadvantages and deficiencies of the prior art, comprises an optical waveguide which is in a single mode or a multiple mode in the center portion thereof and is in a branching mode at each of both end portions thereof to form a plurality of branching waveguides which are positioned symmetrically with respect to the waveguiding direction of the laser lights or beams and which are parallel to each other near the facets, thereby oscillating laser beams with a 0°-phase shift therebetween.

The optical waveguide which is in a single mode in the center portion thereof is, in a preferred embodiment, composed of a single waveguide for cutting off a portion of the light in a high-order transverse mode in the center portion thereof, a plurality of parallel branching waveguides which are disposed in a parallel manner at different spaces in each of both end portions thereof, and curved branching waveguides which optically connect the single waveguide with the parallel branching waveguides. The parallel branching waveguides are disposed in a parallel manner with the differences in light-path length therebetween set in order that the phase shift between the adjacent waveguides is the integral multiple of $2\pi$ with respect to laser beams propagated in the waveguides.

The optical waveguide which is in a multiple mode in the center portion thereof is, in a preferred embodiment, composed of a plurality of main waveguides disposed in a parallel manner in the center portion thereof, and a plurality of parallel branching waveguides disposed in a parallel manner at each of both end portions thereof near the facets, the parallel branching waveguides branching from the main waveguides in such a manner that two branching waveguides branch from each of the main waveguides and the resulting adjacent branching waveguides are optically integrated into one branching waveguide.

Thus, the invention described herein makes is possible to realize the objects of (1) providing a semiconductor laser array device having a plurality of lasing filaments on the same substrate which attains a 0°-phase shift between the adjacent lasing filaments, resulting in high output power laser beams with the radiation pattern of a single peak; and (2) providing a semiconductor laser array device which attains an optical coupling with external optical systems with a high efficiency so that it can be used as a high output laser light source for optical communication, etc.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

(EXAMPLE 1)

Figure 1:
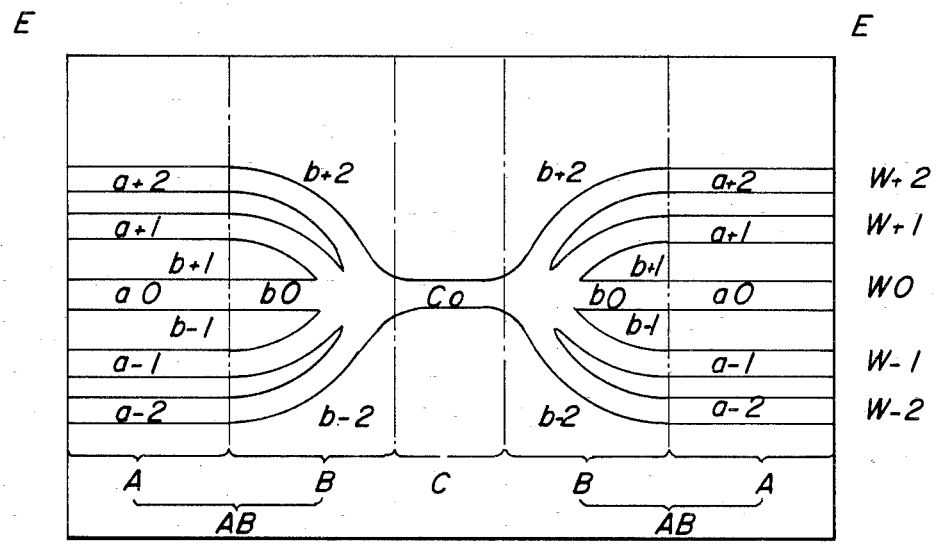
FIG. 1 is a diagram showing an optical waveguide of a semiconductor laser array device of this invention.
Figure 3:
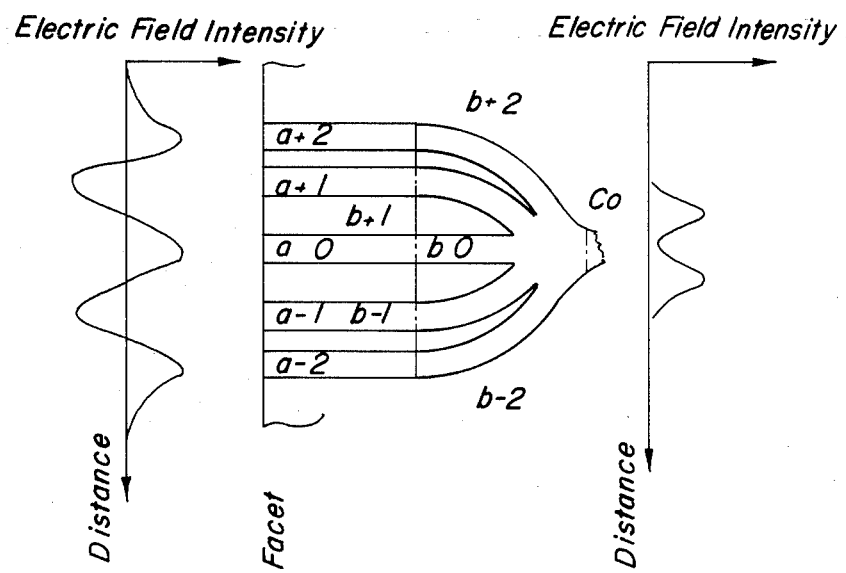
FIG. 3 is a diagram showing the transverse distribution of the electric field of laser beams with a 180°-phase shift therebetween.
Figure 2:
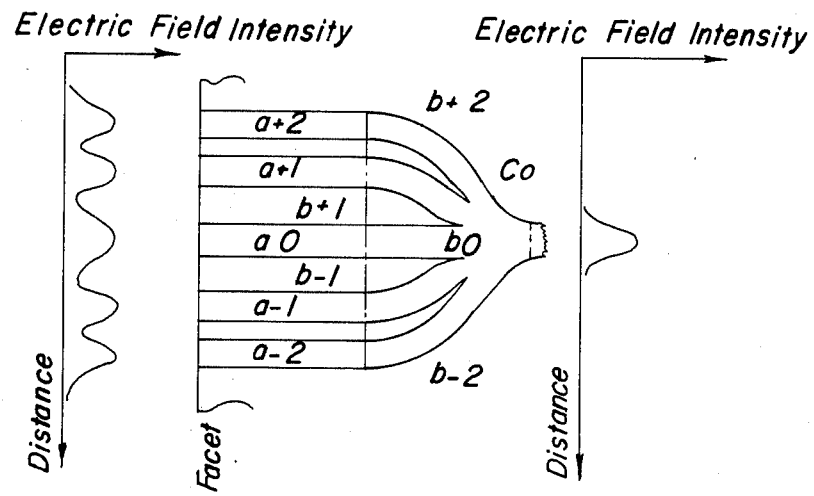
FIG. 2 is a diagram showing the transverse distribution of the electric field of laser beams with a 0°-phase shift therebetween.

FIG. 1 shows an optical waveguide of the semiconductor laser array device of this invention, which is in a single mode in the center portion C thereof to form a single waveguide $C_0$ and is in a branching mode at each of both end portions AB and AB thereof to form a plurality of branching waveguides $W_0$, $W_{+1}$, $W_{+2}$, $W_{-1}$ and $W_{-2}$ which are positioned symmetrically with respect to the waveguiding direction of the laser beams and which are parallel to each other in the portions A and A. The single waveguide $C_0$ in the center portion C functions to cut off a portion of the light in a high-order transverse mode. The branching waveguides $W_0$, $W_{+1}$, $W_{+2}$, $W_{-1}$ and $W_{-2}$ are, respectively, composed of the parallel branching waveguides $a_0$, $a_{+1}$, $a_{+2}$, $a_{-1}$ and $a_{-2}$ disposed in a parallel manner with a different space between the portions A and A near the facets E and E and the curved branching waveguides $b_0$, $b_{+1}$, $b_{+2}$, $b_{-1}$ and $b_{-2}$ disposed to optically connect the single waveguide $C_0$ with the parallel branching waveguides $a_0$, $a_{+1}$, $a_{+2}$, $a_{-1}$ and $a_{-2}$ in the portions B and B. The parallel branching waveguides $a_0$, $a_{+1}$, $a_{+2}$, $a_{-1}$ and $a_{-2}$ are disposed in a parallel manner with a different space therebetween with the space being smaller toward the outer regions. That is, the differences in light-path length among the branching waveguides $W_0$, $W_{+1}$, $W_{+2}$, $W_{-1}$ and $W_{-2}$ are set in order that the phase shift between the adjacent waveguide is the integral multiple of $2\pi$ with respect to laser beams propagated in the waveguides. The spaces among the adjacent parallel branching waveguides $a_0$, $a_{+1}$, $a_{+2}$, $a_{-1}$ and $a_{-2}$ are substantially equal to those of a Fresnel lens, so that the branching waveguides $W_0$, $W_{+1}$, $W_{+2}$, $W_{-1}$ and $W_{-2}$ can attain the same optical effect as common Fresnel lenses. Thus, as shown in FIG. 2, the electric field distribution at the single waveguide $C_0$ when the laser beams have the electric field distribution of a 0°-phase shift therebetween at the facet E, exhibits a single peak in the center. On the contrary, as shown in FIG. 3, the electric field distribution at the single waveguide $C_0$ when the laser beams have the electric field distribution of a 180°-phase shift therebetween at the facet E, exhibits dual peaks on both sides. This means that the laser beams with a 0°-phase shift therebetween in the branching waveguides at the facet are propagated to the single waveguide $C_0$ in the center portion with an optical coupling efficiency of 100%, whereas the laser beams with a 180°-phase shift therebetween in the branching waveguides at the facet are propagated to the single waveguide $C_0$ with the zero optical coupling efficiency. That is, according to this invention, propagation loss of the optical waveguide in the 180°-phase shift mode becomes greater than that of the optical waveguide in the 0°-phase shift mode, and accordingly oscillation threshold gain in the 180°-phase shift mode becomes greater than in the 0°-phase shift mode, so that the 180°-phase shift mode can be suppressed thereby allowing for oscillation in a stable 0°-phase shift mode.

Figure 4:
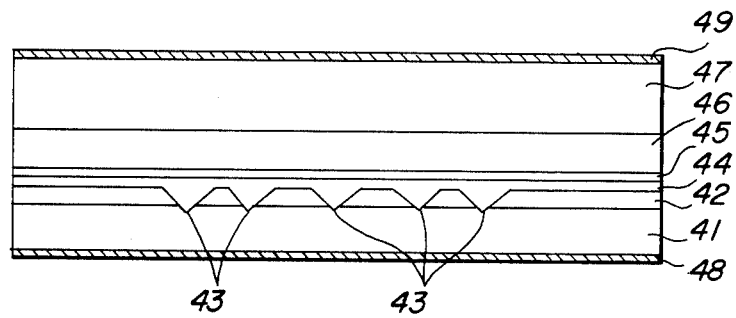
FIG. 4 is a sectional view showing a semiconductor laser array device of this invention.

FIG. 4 shows a semiconductor laser array device comprising the above-mentioned optical-waveguiding structure, which is produced as follows: On a p-GaAs substrate 41, an n-GaAs current blocking layer 42 having a thickness of 1 μm is formed by liquid phase epitaxy, followed by subjecting a chemical etching treatment to form V-shaped channels 42 in the form of the optical waveguide shown in FIG. 1 in such a manner that the channels 43 reach the p-GaAs substrate 41 through the n-GaAs layer 42. Then, on the n-GaAs layer 42 containing the channels 43, a double heterostructure which is composed of an n-GaAlAs cladding layer 44, a p-GaAlAs active layer 45, a p-GaAlAs cladding layer 46 and a p-GaAs cap layer 47, is epitaxially grown. Then, the back face of the substrate 41 is wrapped, resulting in a wafer having a thickness of approximately 100 μm. An Au-Zn alloy material is evaporated as a p-side electrode 48 on the back face of the substrate 41 and Au-Ge-Ni alloy material is evaporated as an n-side electrode 49 on the upper face of the cap layer 47, followed by a heat-treatment at 450° C. to form alloys. Facets are then formed by cleavage, resulting in a semiconductor laser unit having a cavity length of 250 μm. The unit is then mounted on a copper heat sink by an indium metal in such a manner that the n-side thereof is at the lower position, resulting in a semiconductor laser array device.

Figure 5:
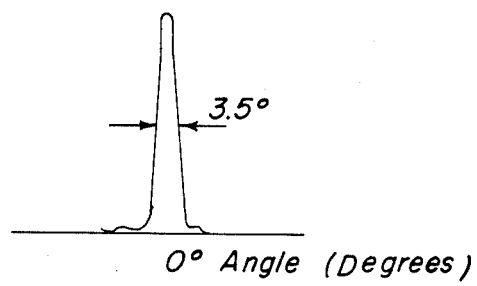
FIG. 5 is a diagram showing the far-field pattern attained by the semiconductor laser array device shown in FIG. 4.

This semiconductor laser array device oscillated with a oscillation wavelength of 780 nm at a threshold current of 230 mA and attained the far-field pattern in the heterojunction direction shown in FIG. 5, which exhibits a single peak having a fullwidth lobe of half of the maximum of 3.5°. This indicates that the above-mentioned semiconductor laser array device attains oscillation with a 0°-phase shift. Moreover, this device produced high output power (in which facet-breakdown occurs) of approximately 400 mW which is about five times that of a conventional semiconductor laser device having a single optical waveguide.

The formation process of the optical waveguide is not essential to the spirit of this invention. Instead of the semiconductor laser materials described in the above-mentioned example, other materials can be used.

(EXAMPLE 2)

Figure 6:
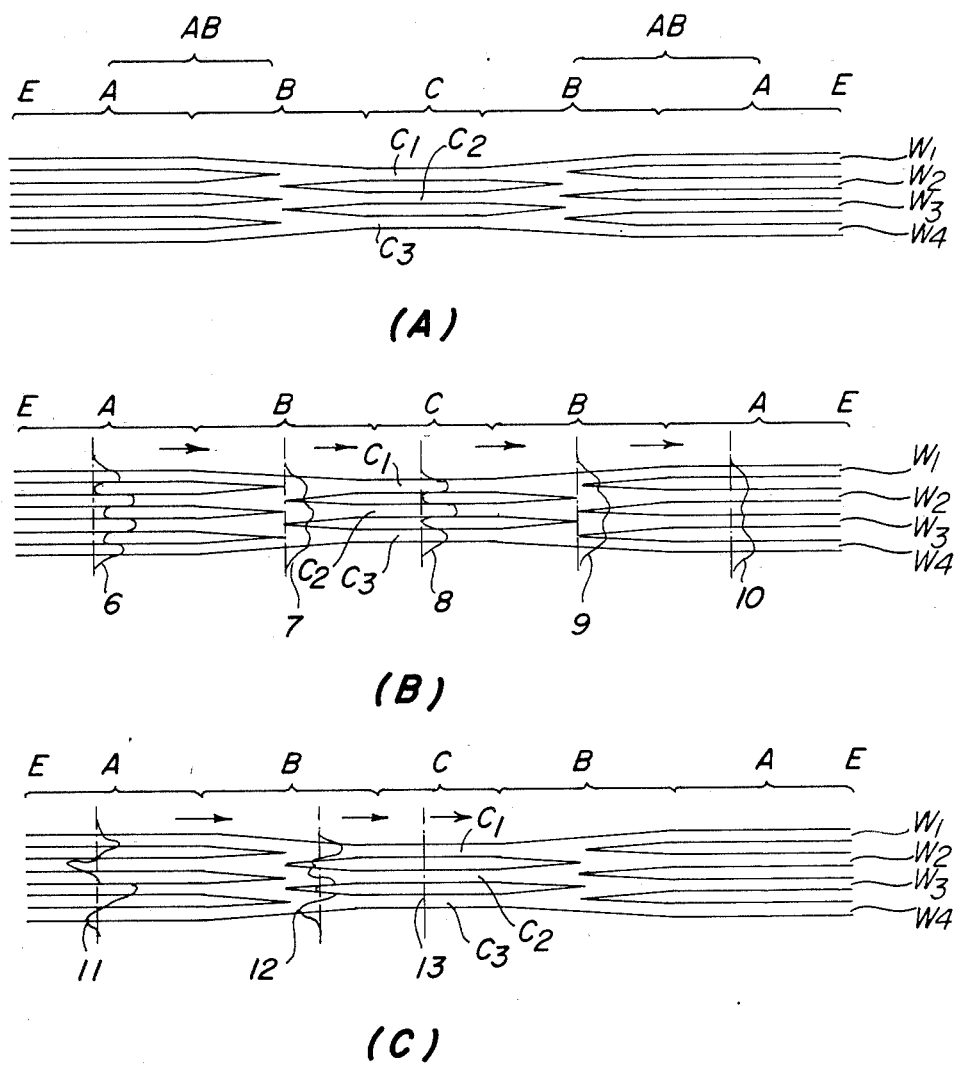
FIGS. 6(A), 6(B) and 6(C), respectively, are diagrams showing other optical waveguides of a semiconductor laser array device of this invention, showing the transverse distribution of the electric field of laser beams with a 0°-phase shift therebetween and showing the transverse distribution of the electric field of laser beams with a 180°-phase shift therebetween.

FIG. 6(A) shows another optical waveguide of the semiconductor laser array device of this invention, which is in a multiple mode in the center portion C thereof to form a plurality of parallel main waveguides $C_1$, $C_2$ and $C_3$ and is in a branching mode at each of both end portions AB and AB thereof to form a plurality of branching waveguides $W_1$, $W_2$, $W_3$ and $W_4$ which are positioned symmetrically with respect to the waveguiding direction of the laser beams and which are parallel to each other in the portions A and A near the facets E and E.

A plurality of main waveguides $C_1$, $C_2$ and $C_3$ are disposed in a parallel manner with an optical coupling in the center portion C. Two branching waveguides branch from each of the main waveguides $C_1$, $C_2$ and $C_3$. The adjacent branching waveguides are integrated into on branching waveguide, resulting in the branching waveguides $W_1$, $W_2$, $W_3$ and $W_4$.

The curves in FIG. 6(B) indicate the transverse distribution of an electric field with regard to the propagated lights at specific portions in the optical waveguide. The basic operation of the laser array device having the above-mentioned waveguiding structure is as follows: Lights 6, which are propagated with a 0°-phase shift therebetween in the branching waveguides in the end portion A near the facet E in the direction from the facet E on the left side to the facet E on the right side, are gradually synthesized to minimize loss in the branching waveguides in the portion B, with the maintenance of the 0°-phase shift relationship therebetween. The synthesized lights 7 proceed to the main waveguides in the center portion C with the same phase, so that the lights 7 are intensified, resulting in lights 8 with a 0°-phase shift therebetween. The lights 8 gradually branch in the branching waveguides of the portion B with the maintenance of the phase relationship therebetween, resulting in beams 9. The beams 9 are propagated to the branching waveguides in the end portion A with the same phase to form beams 10. In such a manner, lights with a 0°-phase shift therebetween are propagated in the optical waveguide from the left to the right. On the contrary, beams, which are propagated with a 0°-phase shift therebetween in the optical waveguide in the direction from the facet E on the right side to the facet E on the left side, proceed in the same manner as mentioned above. As mentioned above, the lights with a 0°-phase shift therebetween are propagated without loss due to the interference at the branching areas of the optical waveguide. On the other hand, lights 11, which are propagated with a 180°-phase shift therebetween in the branching waveguides in the end portion A near the facet E in the direction from the facet E on the left side to the facet E on the right side, are gradually synthesized to maintain the phase relatonship therebetween, resulting in lights 12 which proceed to the main waveguides in the center portion C. When the lights in the branching waveguides are synthesized in the main waveguides, they exhibit a reciprocal phase with each other, so that the beams 13 propagated in the main waveguides in the center portion C are extremely weakened. In such a manner, the beams with a 180°-phase shift therebetween undergo loss due to interference at the synthesizing area of the optical waveguide and thus are allowed to decay.

According to the laser array device having the above-mentioned waveguiding structure, oscillation gain in the 0°-phase shift mode is significantly higher than that in the 180°-phase shift mode, so that oscillation can be attained with a 0°-phase shift, resulting in a radiation pattern having a single peak.

Figure 7:
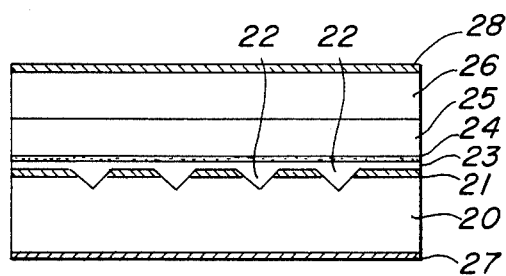
FIG. 7 is a sectional view showing another semiconductor laser array device of this invention.

FIG. 7 shows a semiconductor laser array device comprising the above-mentioned waveguiding structure. This laser array device, which is the combination of an index-guided semiconductor laser and a V-channeled substrate inner stripe semiconductor laser, is produced as follows: On a p-GaAs substrate 20, an n-GaAs current blocking layer 21 is grown by liquid phase epitaxy, followed by a photolithographic treatment and an etching treatment to form V-shaped channels 22 in the form of the optical waveguide shown in FIG. 6(A) in such a manner that the channels 22 reach the substrate 20 through the current blocking layer 21. The portion of each of the channels 22 positioned in the substrate 20 functions as an electric current path. Then, on the current blocking layer 21 containing the channels 22, a p-$Al_xGa_{1-x}$As cladding layer 23, a p- (or n-) $Al_yGa_{1-y}$As active layer 24, an n-$Al_xGa_{1-x}$As cladding layer 25 and an n+-GaAs cap layer 26 are successively grown by liquid phase epitaxy (wherein x>y), resulting in a multiple-layered crystal for laser oscillation of a double heterostructure type. A p-side ohmic contact 27 and an n-side ohmic contact 28 are formed on the back face of the substrate 20 and the upper face of the cap layer 26, respectively. Facets are then formed at right angles with the stripes by cleavage, resulting in a semiconductor laser unit having a cavity length of 200–300 μm. The unit is then mounted on a copper block (not shown), resulting in a semiconductor laser array device.

Figure 8:
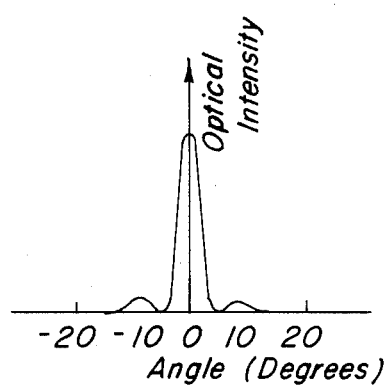
FIG. 8 is a diagram showing the far-field pattern attained by the semiconductor laser array device shown in FIG. 7.

When electric current is injected into the active layer 24, which is disposed in a plane over the V-channels 22, through the electrodes 27 and 28 and the electric current path within the V-channels 22, laser oscillation begins within the portions of the active layer 24 corresponding to the V-channels 22. The semiconductor laser array device obtained in this example oscillated in a single transverse mode up to an output power of 80 mW at an oscillation threshold current of 100 mA and the far-field pattern of radiation laser lights attained thereby is, as shown in FIG. 8, of a single acute peak having a fullwidth lobe of half of the maximum of 4°, which indicates that a plurality of lasing filaments oscillate laser beams with a 0°-phase shift between.

Although the above-mentioned example discloses only the GaAs-GaAlAs system, it is not limited thereto. InP-InGaAsP systems and other semiconductor materials can be applied. Also, as a striped structure, other inner-striped structures can be used instead of the V-channeled substrate inner stripe.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser array device comprising an optical waveguide which is composed of a single waveguide disposed in a center portion thereof and a plurality of branching waveguides disposed at each of both end portions thereof, said branching waveguides being positioned symmetrically with respect to a waveguiding direction of laser beams and being parallel to each other near respective facets, said branching waveguides being different in light-path length from one of said facets to said single mode waveguide in the center portion in order that phase shift between adjacent waveguides is the integral multiple of 2 π with respect to laser beams propagated in said waveguides, thereby oscillating said laser beams with a 0°-phase shift therebetween.

2. A semiconductor laser array device according to claim 1, wherein said single waveguide is a waveguide for cutting off a portion of light in a high-order transverse mode in the center portion thereof, and said branching waveguides are disposed in a parallel manner at different spaces in each of both end portions thereof, and have curved branching waveguides which optically connect said single waveguide with said parallel branching waveguides.

3. A semiconductor laser array device comprising an optical waveguide which is composed of a plurality of main waveguides disposed in a parallel manner in a center portion thereof, and a plurality of parallel branching waveguides disposed symmetrically with respect to a waveguiding direction of laser beams and in a parallel manner at each of both end portions thereof near respective facets, said parallel branching waveguides branching from said main waveguides in such a manner that two branching waveguides branch from each of said main waveguides and the resulting adjacent branching waveguides are optically integrated into one branching waveguide, thereby oscillating laser beams with a 0°-phase shift therebetween.

* * * * *